United States Patent
Kikuta (10) Patent No.: US 11,894,626 B2
(45) Date of Patent: Feb. 6, 2024

(54) CIRCUIT APPARATUS

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Takamune Kikuta, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 98 days.

(21) Appl. No.: 17/438,074

(22) PCT Filed: Dec. 19, 2019

(86) PCT No.: PCT/JP2019/049862
§ 371 (c)(1),
(2) Date: Sep. 10, 2021

(87) PCT Pub. No.: WO2020/183850
PCT Pub. Date: Sep. 17, 2020

(65) Prior Publication Data
US 2022/0255249 A1    Aug. 11, 2022

(30) Foreign Application Priority Data
Mar. 14, 2019   (JP) ................. 2019-047232

(51) Int. Cl.
*H01R 13/58*   (2006.01)
*H01R 12/58*   (2011.01)
(Continued)

(52) U.S. Cl.
CPC ............ *H01R 12/58* (2013.01); *H01R 12/73* (2013.01); *H01R 13/2464* (2013.01);
(Continued)

(58) Field of Classification Search
CPC .... H01R 12/58; H01R 12/73; H01R 13/2464; H01R 13/514; H01R 13/516; H01R 24/58;
(Continued)

(56) References Cited

U.S. PATENT DOCUMENTS 3,022,480 A * 2/1962 Frank ............... H05K 1/0287
174/262
3,212,049 A * 10/1965 Mittler ............... H01R 12/523
439/45

(Continued)

FOREIGN PATENT DOCUMENTS

JP    S51-077594 U    6/1976
JP    H04-134075 U   12/1992
(Continued)

OTHER PUBLICATIONS

International Search Report dated Feb. 4, 2020 for WO 2020/183850 A1 (6 pages).

*Primary Examiner* — Truc T Nguyen
(74) *Attorney, Agent, or Firm* — Venjuris, P.C.

(57) ABSTRACT

A circuit apparatus includes: a stacked body; and a plurality of terminals. The stacked body includes a plurality of layers. A plurality of holes that extend through the plurality of layers are formed in the stacked body. Each of the plurality of layers includes a connection member that is formed of a conductor. The connection member includes: a plurality of connection portions that are provided at positions corresponding to the plurality of holes; and a joining portion that connects the plurality of connection portions to each other.

(Continued)

The plurality of terminals include a plurality of types of terminals that correspond to the plurality of layers. Each of the plurality of types of terminals can be selectively connected to the connection portion of a corresponding one of the plurality of layers by being inserted into a predetermined one of the plurality of holes.

8 Claims, 7 Drawing Sheets

(51) Int. Cl.
    *H01R 12/73* (2011.01)
    *H01R 13/24* (2006.01)
    *H01R 13/514* (2006.01)
    *H01R 13/516* (2006.01)
    *H05K 1/11* (2006.01)

(52) U.S. Cl.
    CPC ......... *H01R 13/514* (2013.01); *H01R 13/516* (2013.01); *H05K 1/119* (2013.01)

(58) Field of Classification Search
    CPC ...... H01R 12/523; H01R 11/01; H05K 1/119; H05K 2201/10363; H05K 3/326; H05K 3/4046
    See application file for complete search history.

(56) References Cited

U.S. PATENT DOCUMENTS

| | | | | |
|---|---|---|---|---|
| 3,400,358 A | * | 9/1968 | Byrnes | H01R 13/33 439/825 |
| 3,853,377 A | * | 12/1974 | Shlesinger, Jr. | H01R 13/15 439/825 |
| 4,054,939 A | | 10/1977 | Ammon | |
| 4,446,505 A | * | 5/1984 | Long | H01R 12/585 439/387 |
| 4,859,188 A | * | 8/1989 | Neumann | H01R 12/523 439/83 |
| 4,889,496 A | * | 12/1989 | Neidich | H01R 12/523 439/840 |
| 5,152,696 A | * | 10/1992 | Krajewski | H05K 3/368 439/931 |
| 5,544,004 A | * | 8/1996 | Inagaki | H02B 1/207 439/43 |
| 5,857,858 A | * | 1/1999 | Gorowitz | H05K 3/325 439/86 |
| 6,354,868 B1 | * | 3/2002 | Korczynski | H05K 1/0287 439/82 |
| 7,963,776 B1 | | 7/2011 | Morgan | |
| 10,547,128 B1 | * | 1/2020 | Lin | H01R 12/585 |
| 10,630,004 B2 | * | 4/2020 | Hashiguchi | H01R 12/79 |
| 2005/0239300 A1 | * | 10/2005 | Yasumura | H01R 13/6587 439/65 |
| 2006/0160409 A1 | * | 7/2006 | Shimizu | H05B 45/40 439/490 |
| 2008/0009146 A1 | * | 1/2008 | Kim | H05K 3/4641 439/55 |
| 2011/0281474 A1 | * | 11/2011 | Weinmann | H05K 1/0218 439/676 |
| 2013/0231009 A1 | * | 9/2013 | Jeon | H01R 13/2442 439/660 |
| 2020/0068703 A1 | * | 2/2020 | Kagaya | H04B 10/50 |
| 2022/0094247 A1 | * | 3/2022 | Takeshima | H02K 1/276 |
| 2023/0045290 A1 | * | 2/2023 | Lee | H10N 70/20 |

FOREIGN PATENT DOCUMENTS

| | | |
|---|---|---|
| JP | 2002-010444 A | 1/2002 |
| JP | 2004-030993 A | 1/2004 |
| JP | 2018-116767 A | 7/2018 |

* cited by examiner

CIRCUIT APPARATUS

CROSS REFERENCE TO RELATED APPLICATIONS

This application is a national phase of PCT application No. PCT/JP2019/049862, filed on 19 Dec. 2019, which claims priority from Japanese patent application No. 2019-047232, filed on 14 Mar. 2019, all of which are incorporated herein by reference.

TECHNICAL FIELD

The present disclosure relates to a circuit apparatus.

BACKGROUND

Patent Document 1 discloses a stacked joint connector including: a stacked body that includes a plurality of single-layer units in each of which a plurality of stack terminals are arranged in a planar manner in a single-layer housing; and a plurality of male terminals that extend through the stacked body in the stacking direction and are selectively connected to the stack terminals, wherein the stack terminals of different single-layer units are connected by the male terminals.

Patent Document 2 discloses an electrical junction box including: a module plate stack in which a plurality of module plates are stacked by connecting electric wires to connection members that are provided on the module plates; and connection bars that extend through the module plates included in the module plate stack, wherein a desired circuit is configured by passing the connection bars through the module plate stack to electrically connect the connection members of the module plates.

PRIOR ART DOCUMENT

Patent Document

Patent Document 1: JP 2004-030993 A
Patent Document 2: JP 2002-010444 A

SUMMARY OF THE INVENTION

Problems to be Solved

When a change is to be made to the design of the circuit configuration of the stacked joint connector disclosed in Patent Document 1, electric wires need to be unplugged and plugged, and thus the connection partners of the terminals need to be checked. Likewise, when a change is to be made to the design of the circuit configuration of the electrical junction box disclosed in Patent Document 2, electric wire connection fittings need to be replaced, which requires the electrical junction box to be disassembled.

Accordingly, it is an object of the present disclosure to provide a technique that makes it easy to make a change to the design of a connection portion in a circuit.

Means to Solve the Problem

A circuit apparatus according to the present disclosure includes: a stacked body; and a plurality of terminals, wherein the stacked body includes a plurality of layers, a plurality of holes that extend through the plurality of layers are formed in the stacked body, each of the plurality of layers includes a connection member that is formed of a conductor, the connection member includes: a plurality of connection portions that are provided at positions corresponding to the plurality of holes; and a joining portion that connects the plurality of connection portions to each other, the plurality of terminals include a plurality of types of terminals that correspond to the plurality of layers, and each of the plurality of types of terminals can be selectively connected to the connection portion of a corresponding one of the plurality of layers by being inserted into a predetermined one of the plurality of holes.

Effect of the Invention

According to the present disclosure, it is easy to make a change to the design of a connection portion in a circuit.

DETAILED DESCRIPTION TO EXECUTE THE INVENTION

Description of Embodiment of the Present Disclosure

Embodiments of the present disclosure will be listed and described first.

A circuit apparatus according to the present disclosure is as follows.

(1) A circuit apparatus including: a stacked body; and a plurality of terminals, wherein the stacked body includes a plurality of layers, a plurality of holes that extend through the plurality of layers are formed in the stacked body, each of the plurality of layers includes a connection member that is formed of a conductor, the connection member includes: a plurality of connection portions that are provided at positions corresponding to the plurality of holes; and a joining portion that connects the plurality of connection portions to each other, the plurality of terminals include a plurality of types of terminals that correspond to the plurality of layers, and each of the plurality of types of terminals can be selectively connected to the connection portion of a corresponding one of the plurality of layers by being inserted into a predetermined one of the plurality of holes.

As the plurality of terminals, a plurality of types of terminals that correspond to the plurality of layers are provided, and each of the plurality of types of terminals can be selectively connected to the connection portion of a corresponding one of the plurality of layers by being inserted into a predetermined one of the plurality of holes. Accordingly, the terminals can be connected to corresponding layers by being unplugged and plugged, which makes it easy to make a change to the design of the connection portion of the circuit.

(2) The plurality of types of terminals may include coated terminals. Each of the coated terminals may include a terminal main body and an insulation coating. The terminal main body may include a first portion that corresponds to a layer that serves as a connection partner and a second portion that corresponds to layers that do not serve as the connection partner. The insulation coating may be formed around the second portion. In this case, with the insulation coating, it is possible to suppress the likelihood of the terminal main body being connected to the layers that do not serve as the connection partner.

(3) The plurality of layers may include a first layer and a second layer. The plurality of types of terminals may include a first layer terminal and a second layer terminal. The second layer may be located on a terminal insertion side relative to the first layer, the terminal insertion side being where the terminals are inserted. The first layer terminal may be a terminal that is connected to the first layer. The second layer terminal may be a terminal that is connected to the second layer, and may be shorter than the first layer terminal. In this case, the second layer terminal is shorter than first layer terminal, and thus the second layer terminal is unlikely to be connected to the first layer.

(4) The holes formed in the first layer may be smaller than the holes formed in the second layer. The first layer terminal may be connected to the first layer while passing through one of the holes formed in the first layer and one of the holes formed in the second layer. The second layer terminal may be connected to the second layer while passing through another one of the holes formed in the second layer. The second layer terminal may be formed to be larger than the hole formed in the first layer. In this case, the second layer terminal is unlikely to pass through the hole formed in the first layer, and thus the second layer terminal is unlikely to be connected to the first layer.

(5) The plurality of layers may have different thicknesses. In this case, the portions of the terminals that are to be connected to corresponding layers are provided at different positions, and it is therefore possible to suppress the likelihood of the circuit apparatus being used with the terminals being insufficiently inserted.

(6) The plurality of layers may include a plurality of voltage layers that have different voltage values in the connection members. In this case, the terminals can be selectively connected to different power supply voltages.

(7) The plurality of voltage layers may be stacked such that the voltage value increases in order from the terminal insertion side. In this case, the likelihood of the low-voltage layer being accidentally connected to the high-voltage layer can easily be suppressed.

(8) The plurality of voltage layers may include: a first voltage layer that is connected to a first battery that has a first voltage value; and a second voltage layer that is connected to a second battery that has a second voltage value lower than the first voltage value. In this case, different power supply voltages can be easily supplied.

(9) The plurality of layers may include a communication layer. In this case, a communication line can be connected to the communication layer.

(10) The circuit apparatus may further include an electronic control unit. The electronic control unit may be connected to the communication layer, and selectively transmit, to the communication layer, a signal transmitted from an external device to a device that is connected to the communication layer. In this case, the electronic control unit can selectively determine a signal to be transmitted to the device connected to the communication layer.

Detailed Description of Embodiment of the Present Disclosure

A specific example of the circuit apparatus according to the present disclosure will be described below with reference to the drawings. It is to be noted that the present invention is not limited to examples given below, the scope of the present invention is indicated by the appended claims, and all changes that come within the meaning and range of equivalency of the claims are intended to be embraced within the scope of the present invention.

Embodiment 1

Figure 1:
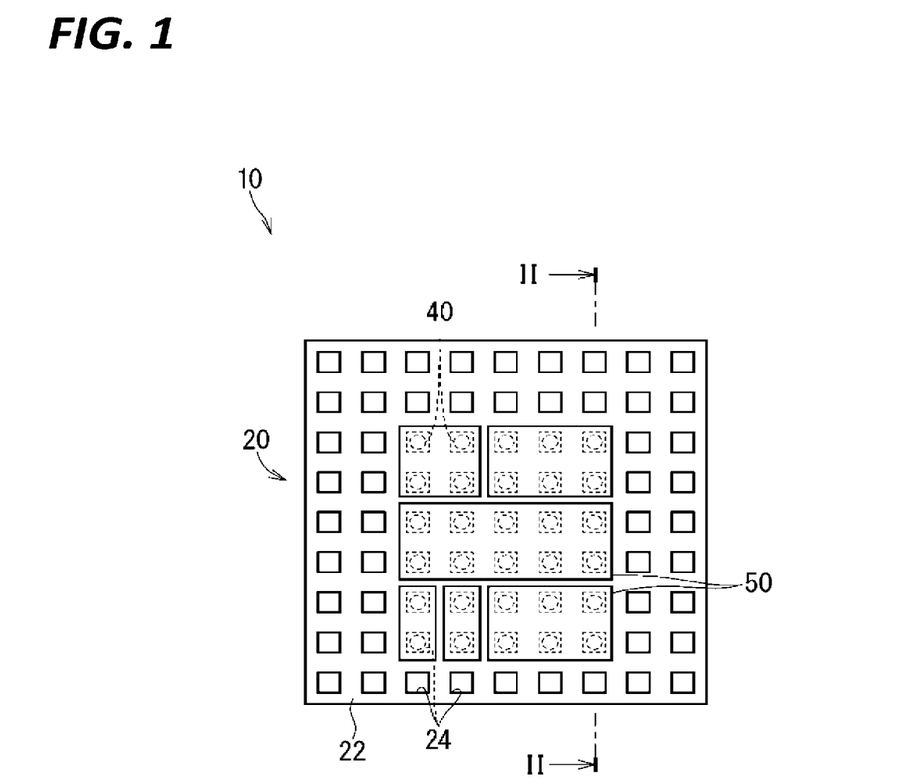
FIG. 1 is a plan view of a circuit apparatus according to Embodiment 1.
Figure 2:
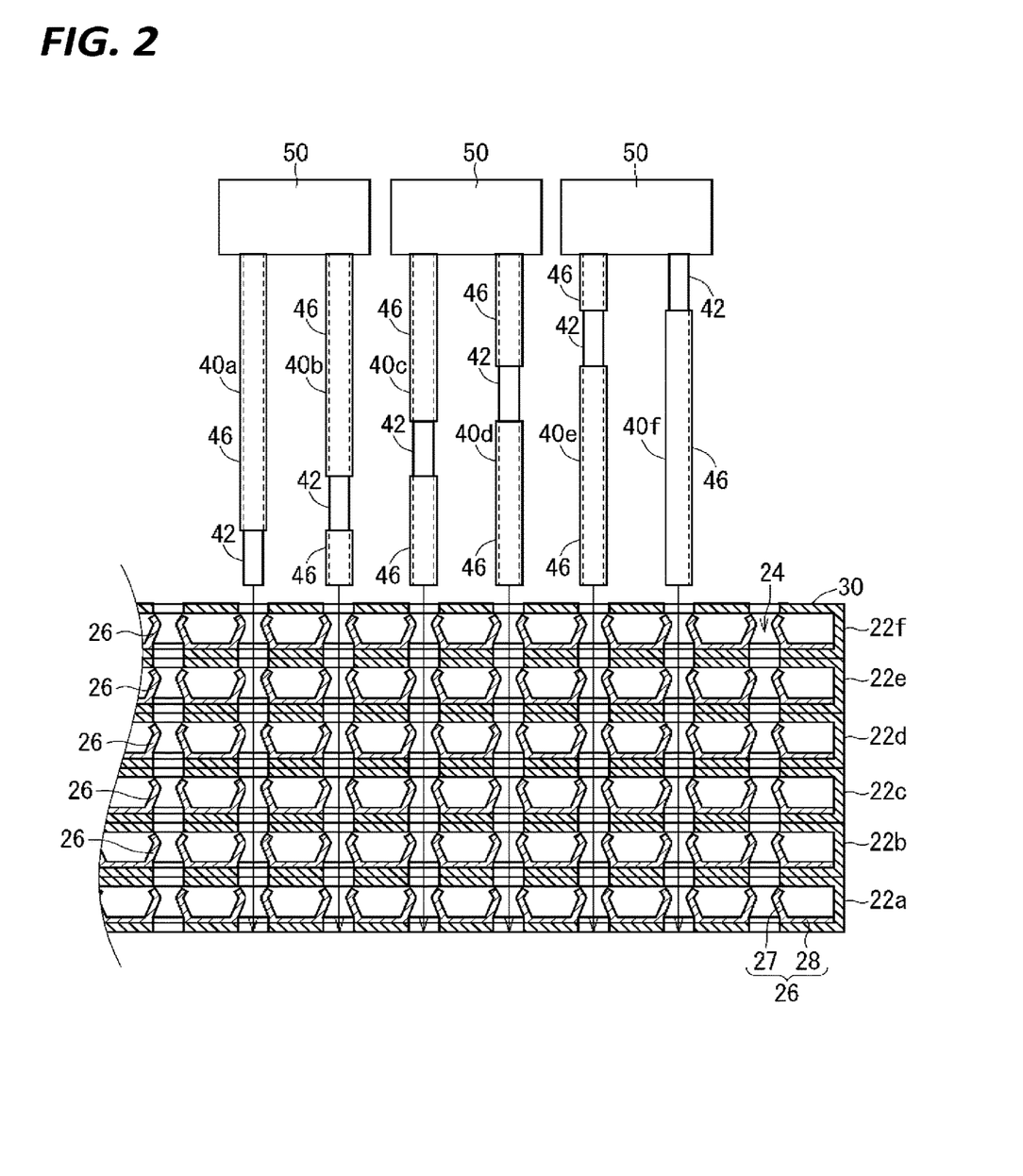
FIG. 2 is a schematic cross-sectional view taken along the line II-II shown in FIG. 1.
Figure 3:
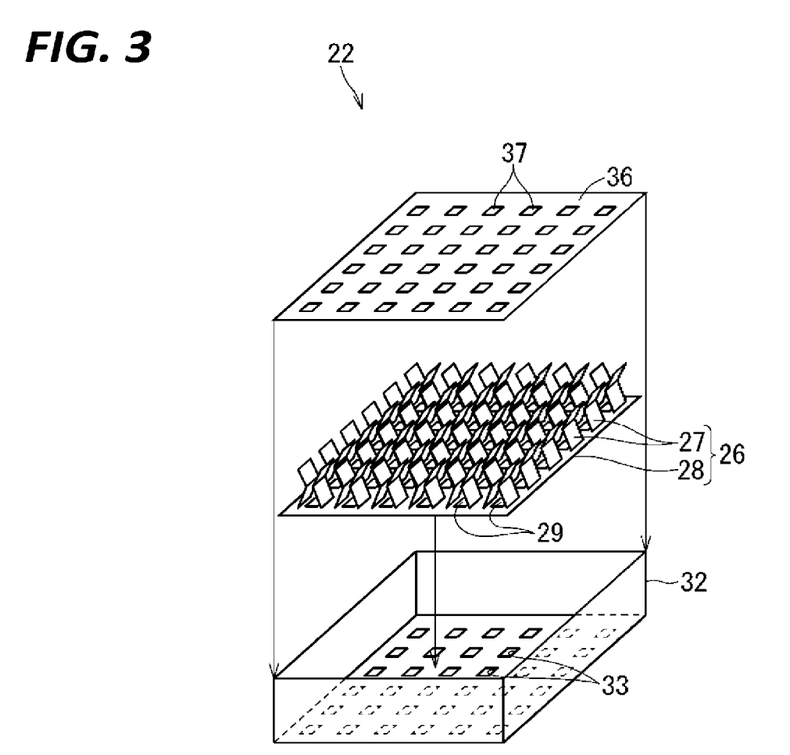
FIG. 3 is an exploded perspective view of a layer that is included in a stacked body.

Hereinafter, a circuit apparatus according to Embodiment 1 will be described. FIG. 1 is a plan view of a circuit apparatus 10 according to Embodiment 1. FIG. 2 is a schematic cross-sectional view taken along the line II-II shown in FIG. 1. In FIG. 2, terminals 40 are not shown in the cross-sectional view. FIG. 3 is an exploded perspective view of a layer 22 included in a stacked body 20.

The circuit apparatus 10 includes a stacked body 20 and a plurality of terminals 40. The stacked body 20 includes a plurality of (in this example, six) layers 22. A plurality of holes 24 that extend through the plurality of layers 22 are formed in the stacked body 20. A terminal 40 can be inserted into each hole 24. An opening of each hole 24 formed in the stacked body 20 serves as an insertion port through which a terminal 40 is inserted. The terminal 40 inserted into the hole 24 is electrically connected to one of the plurality of layers 22. In the stacked body 20, different layers 22 are not electrically connected to each other. In this example, the layers 22 have the same configuration. However, the layers may have different configurations. Hereinafter, where it is necessary to make a distinction between the six layers 22, the six layers 22 may be referred to as "layers 22a, 22b, 22c, 22d, 22e, and 22f".

Each layer 22 includes a connection member 26 that is formed of a conductor. The connection member 26 includes a plurality of connection portions 27 and a joining portion 28 that connects the plurality of connection portions 27 to each other. The plurality of connection portions 27 are provided at positions corresponding to the plurality of holes 24. In each layer 22, the plurality of connection portions 27 are connected by the joining portion 28, and thus the plurality of connection portions 27 have the same potential. In the present embodiment, the joining portion 28 is formed by forming a plurality of holes 29 in a flat plate-like member. Each connection portion 27 includes a pair of plate-like portions protruding from the circumferential portion of a hole 29 in the axial direction of the hole 29. The plate-like portions form a leaf spring. More specifically, the pair of plate-like portions is formed such that portions of the pair of plate-like portions extending from a base end portion to a middle portion gradually approach each other so as to close the hole 29. Portions of the pair of plate-like portions extending from the middle portion to a leading end portion are gradually spaced apart from each other so as to open the hole 29. The spacing between the closest proximity portions of the pair of plate-like portions at which the pair of plate-like portions are closest to each other is smaller than the thickness dimension of a terminal 40. The leading end portions extending from the closest proximity portions function as a guide portion for guiding a terminal 40 to the closest proximity portions. Accordingly, when a terminal 40 is inserted into a hole 24, the leading end of the terminal 40 is guided from the guide portion to the closest proximity portions, and the closest proximity portions widen and come into contact with the terminal 40. Accordingly, at least the closest proximity portions of the connection portion 27 can be electrically connected to the terminal 40. The connection portions 27 and the joining portion 28 may be formed separately and then welded together. The connection portions 27 may be formed by cutting and raising the portions of the flat plate-like member that constitutes the joining portion 28.

The connection member 26 included in each layer 22 is supported at a fixed position. The fixed position is a position at which the holes 29 formed in the connection member 26 are aligned. In this example, each layer 22 includes a housing 30. The housing 30 can house the connection member 26. The connection member 26 housed in the housing 30 is supported at a fixed position in the housing 30. As a result of the housings 30 being positioned to overlap each other, in the stacked body 20, the connection members 26 included in the layers 22 are supported at fixed positions. Accordingly, the housings 30 function as supporting members for supporting the connection members 26 at fixed positions.

The housings 30 each include a box 32 and a cover 36. The box 32 is formed as a rectangular parallelepiped box with an opening on one side. The connection members 26 can be housed in the box 32. The cover 36 is formed as a flat square plate. The cover 36 can close the opening of the box 32 with the connection members 26 being housed in the box 32. In this example, the opening is formed on a side of the box 32 that faces in the stacking direction. For this reason, a plurality of holes 33 are formed in the bottom of the box 32 positioned on the opposite side of the opening. A plurality of holes 37 are also formed in the cover 36. The holes 33 in the bottom of the box 32 and the holes 37 in the cover 36 are formed at positions corresponding to the holes 29 in the connection members 26. That is, the holes 33 in the bottom of the box 32 and the holes 37 in the cover 36 are arranged in the same pattern, and form a portion of holes 24 in the stacked body 20 together with the holes 29 in the connection members 26. Also, the holes 33 and 37 are arranged in the same pattern in the plurality of housings 30.

The housings 30 other than the housing 30 provided at one end in the stacking direction may not include the cover 36. In this case, a housing 30 that is disposed overlapping the opening side of a housing 30 that does not include the cover 36 serves as a cover that closes the opening of the housing 30 that does not include the cover 36.

In the case where a plurality of housings 30 are stacked, fixing portions that fix the stacked housings 30 to each other may be provided. For example, screw holes serving as fixing portions may be formed at corners or the like of each box 32 and the plurality of housings 30 may be screwed together. Alternatively, for example, as the fixing portions, protrusions and recesses for combining the boxes 32 may be formed.

The plurality of terminals 40 include a plurality of types of terminals 40a, 40b, 40c, 40d, 40e, and 40f that correspond to the plurality of layers 22. Each of the plurality of types of terminals 40a, 40b, 40c, 40d, 40e, and 40f is inserted into a predetermined one of the plurality of holes 24, and can be selectively connected to the connection portion 27 of a corresponding one of the plurality of layers 22 including the layers 22a, 22b, 22c, 22d, 22e, and 22f. Here, an example will be described in which the terminal 40a is connected to the layer 22a, the terminal 40b is connected to the layer 22b, the terminal 40c is connected to the layer 22c, the terminal 40d is connected to the layer 22d, the terminal 40e is connected to the layer 22e, and the terminal 40f is connected to the layer 22f.

The plurality of types of terminals 40a, 40b, 40c, 40d, 40e, and 40f are coated terminals. Each coated terminal includes a terminal main body 42 and an insulation coating 46. The terminal main body 42 is formed of a conductor. The terminal main body 42 includes a first portion that corresponds to a layer 22 that serves as a connection partner and a second portion that corresponds to layers 22 that do not serve as the connection partner. The insulation coating 46 is formed around the second portion. In the plurality of types of terminals 40a, 40b, 40c, 40d, 40e, and 40f, the terminal main bodies 42 are formed in the same shape. As a result of the insulation coatings 46 being formed at different positions of the terminal main bodies 42 that have the same shape, it is possible to obtain a plurality of types of terminals 40a, 40b, 40c, 40d, 40e, and 40f that can correspond to the layers 22.

As described above, the plurality of types of terminals 40a, 40b, 40c, 40d, 40e, and 40f can be connected to the predetermined layers 22 by being inserted into the stacked body 20. Also, the plurality of types of terminals 40a, 40b, 40c, 40d, 40e, and 40f can be disconnected from the predetermined layers 22 by being unplugged from the stacked body 20. Accordingly, by attaching and detaching the plurality of types of terminals 40a, 40b, 40c, 40d, 40e, and 40f to and from the stacked body 20, it is possible to make a change to the design of the circuit apparatus 10.

The plurality of terminals 40 are held by holding members 50. For example, the plurality of terminals 40 may be divided into groups according to a device, a system, or the like such that each group of terminals 40 is held by a different holding member 50. With this configuration, the plurality of terminals 40 that are held by a holding member 50 can be collectively attached and detached to and from the stacked body 20. The terminals 40 protrude from the holding members 50 by a predetermined length. The holding members 50 may come into contact with the surface of the stacked body 20, with the terminals 40 being inserted into the stacked body 20 by a predetermined length. In this case, the holding members 50 prevent the terminals 40 from being excessively inserted into the stacked body 20. The holding members 50 may be portions of devices or connector housings provided at end portions of electric wires extending from devices.

<Circuit Apparatus in Vehicle>

Figure 4:
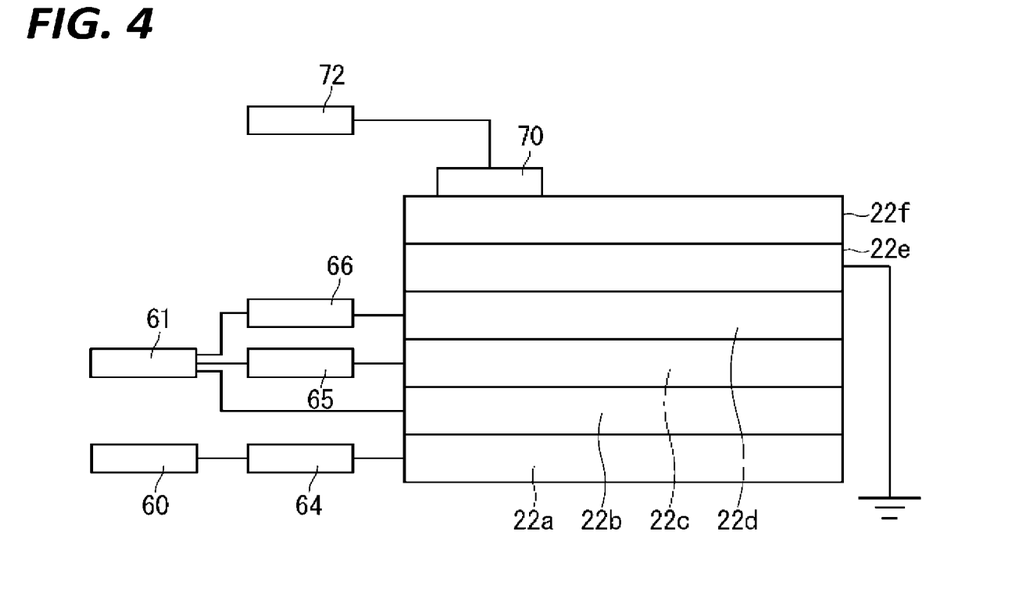
FIG. 4 is a block diagram showing a connection example in which the circuit apparatus is applied to a vehicle.

An example will be described in which the circuit apparatus 10 described above is applied to a vehicle. FIG. 4 is a block diagram showing a connection example in which the circuit apparatus 10 is applied to a vehicle. Here, an example will be described in which the vehicle to which the circuit apparatus 10 is applied is a vehicle, such as a hybrid vehicle or an electric vehicle, that includes batteries 60 and 61.

In the circuit apparatus 10, the layers 22a, 22b, 22c, and 22d serve as voltage layers, and the layer 22e serves as a ground layer, and the layer 22f serves as a communication layer. As described above, the plurality of layers 22 include the plurality of voltage layers 22a, 22b, 22c, and 22d, the ground layer 22e, and the communication layer 22f. The terminals 40 are inserted into the circuit apparatus 10 from the side on which the communication layer 22f is provided. In the circuit apparatus 10, the communication layer 22f, the ground layer 22e, and the plurality of voltage layers 22d, 22c, 22b, and 22a are stacked in this order from the side on which the insertion ports of the terminals 40 are provided.

The plurality of voltage layers 22a, 22b, 22c, and 22d are stacked such that the voltage value increases in order from the side on which the insertion ports of the terminals 40 are provided (from the side on which the communication layer 22f is provided in the example shown in FIG. 4). Accordingly, in this example, the voltage value increases in the following order: the voltage layer 22d, the voltage layer 22c, the voltage layer 22b, and the voltage layer 22a. For example, the plurality of voltage layers 22d, 22c, 22b, and 22a have voltage values of 3.3 volts, 5 volts, 12 volts, and 24 volts, respectively. As described above, the plurality of layers 22 include a plurality of voltage layers that have different voltage values in the connection members 26. For example, the voltage layers with voltage values of 3.3 volts and 5 volts may be used as a power supply for communication, and the voltage layers with voltage values of 12 volts and 24 volts may be used as a power supply for purposes other than communication.

The plurality of voltage layers include a first voltage layer and a second voltage layer. The first voltage layer is a voltage layer that is connected to a first battery 60 that has a first voltage value. The second voltage layer is connected to a second battery 61 that has a second voltage value lower than the first voltage value. For example, the first battery 60 is a driving battery, and the second battery 61 is an auxiliary battery. The first voltage value of the first battery 60 is, for example, several hundred volts. The second voltage value of the second battery 61 is, for example, 12 volts.

In the example shown in FIG. 4, the voltage layer 22a is connected to the driving battery 60, and the voltage layers 22b, 22c, and 22d are connected to the auxiliary battery 61. Accordingly, in this example, the voltage layer 22a serves as the first voltage layer, and the voltage layers 22b, 22c, and 22d serve as the second voltage layer. The voltage layer 22a may be connected to the driving battery 60 via a transformer (DC-DC converter) 64. With this configuration, the voltage value of the driving battery 60 can be converted to a predetermined voltage value in the voltage layer 22a. Also, the voltage layers 22c and 22d in which voltage values different from the voltage value of the auxiliary battery 61 are set may be connected to the auxiliary battery 61 via DC-DC converters 65 and 66, respectively. With this configuration, the voltage value of the auxiliary battery 61 can be converted to a predetermined voltage value in each of the voltage layers 22c and 22d.

Power supplied from the batteries 60 and 61 to the voltage layers 22a, 22b, 22c, and 22d may be supplied from the insertion ports of the terminals 40 of the stacked body 20. That is, as a result of the terminals 40 provided at the end portions of electric wires for supplying power from the batteries 60 and 61 being inserted into the holes 24 formed in the stacked body 20, the predetermined voltage layers 22a, 22b, 22c, and 22d may be connected. Also, the predetermined voltage layers 22a, 22b, 22c, and 22d may also include battery connection ports to which the terminals provided at the end portions of electric wires for supplying power from the batteries 60 and 61 are connected.

The communication layer 22f is connected to an electronic control unit (ECU) 70. In this way, the circuit apparatus 10 may further include the ECU 70. The ECU 70 selectively transmits, to the communication layer 22f, a signal transmitted from an external device to the device connected to the communication layer 22f. With this configuration, the device connected to the communication layer 22f is unlikely to receive unnecessary signals. In the example shown in FIG. 4, terminals 40 provided in the ECU 70 are inserted into the insertion ports of the terminals 40 of the stacked body 20 and connected to the communication layer 22f. The communication layer 22f may also include ECU connection ports for connecting to the terminals provided in the ECU 70.

The ground layer 22e is connected to negative wiring of the devices connected to the voltage layers 22a, 22b, 22c, and 22d of the circuit apparatus 10. In this example, only one ground layer 22e is provided in the circuit apparatus 10. The ground layer 22e is connected, for example, to the vehicle ground. A terminal at the end portion of the wiring used to connect the ground layer 22e and the vehicle ground is connected to a ground terminal connection port provided separately from the insertion ports of the terminals 40 of the stacked body 20. Naturally, the terminal at the end portion of the wiring used to connect the ground layer 22e and the vehicle ground may be connected to the ground layer 22e by being inserted into the insertion port of the terminal 40 of the stacked body 20. The ground layer 22e may be connected to the negative terminal of a battery via an electric wire.

Figure 5:
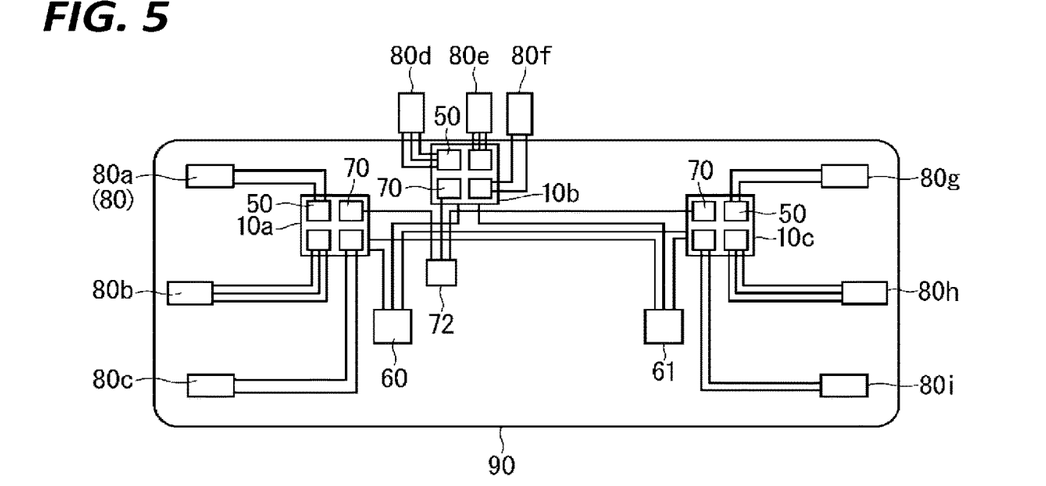
FIG. 5 is a block diagram showing a wiring example in which the circuit apparatus is applied to a vehicle.

FIG. 5 is a block diagram showing a wiring example in which the circuit apparatus 10 is applied to a vehicle 90. In the example shown in FIG. 5, a plurality of (in this example, three) circuit apparatuses 10 are mounted on the vehicle 90. Where it is necessary to make a distinction between the three circuit apparatuses, the three circuit apparatuses will be referred to as "circuit apparatuses 10a, 10b, and 10c". The plurality of circuit apparatuses 10 are each connected to the driving battery 60 and the auxiliary battery 61. Accordingly, power is supplied to the voltage layers 22a, 22b, 22c, and 22d of each of the circuit apparatuses 10. Also, the ECUs 70 included in the plurality of circuit apparatuses 10 are each connected to a central ECU 72. A plurality of devices 80 are connected to each of the plurality of circuit apparatuses 10 in the vehicle. For example, the plurality of devices 80 may be connected to the circuit apparatus 10 located in the vicinity thereof. Alternatively, for example, the plurality of devices 80 may be connected to the circuit apparatus 10 located in the same space (for example, an engine room, an instrument panel, a door, a vehicle compartment, a trunk, or the like) as the plurality of devices 80.

In the example shown in FIG. 5, devices 80a, 80b, and 80c (for example, a headlamp, a sensor, and the like) mounted on a front portion of the vehicle 90 are connected to a circuit apparatus 10a mounted on the front portion of the vehicle 90. Likewise, devices 80d, 80e, and 80f (for example, an electric door lock, a power window, a side-view mirror, or the like) mounted on a door are connected to a circuit apparatus 10b mounted on the door. Devices 80g, 80h, and 80i (for example, a tail lamp, a sensor, and the like) mounted on a rear portion of the vehicle 90 are connected to a circuit apparatus 10c mounted on the rear portion of the vehicle 90.

With the circuit apparatus 10 configured as described above, as the plurality of terminals 40, a plurality of types of terminals 40a, 40b, 40c, 40d, 40e, and 40f corresponding to the plurality of layers 22 are provided, and each of the plurality of types of terminals 40a, 40b, 40c, 40d, 40e, and 40f is inserted into a predetermined one of the plurality of insertion ports and selectively connected to the connection portion 27 of a corresponding one of the plurality of layers 22. Accordingly, the terminals 40 can be connected to corresponding layers 22 by being unplugged and plugged, which makes it easy to make a change to the design of the connection portion of the circuit. Because coated terminals each including a terminal main body 42 and an insulation coating 46 are used, the insulation coating 46 can prevent the terminal main body 42 from being connected to layers 22 that do not serve as the connection partner.

The plurality of layers 22 include the voltage layers 22*a*, 22*b*, 22*c*, and 22*d* that have different voltage values in the connection members 26, and thus the terminals 40 can be selectively connected to different power supply voltages. The plurality of the voltage layers 22*a*, 22*b*, 22*c*, and 22*d* are stacked such that the voltage value increases in order from the side where the terminals 40 are inserted, and thus the likelihood of the terminal 40*d* of the low-voltage layer 22*d* being accidentally connected to the high-voltage layer 22*a* can easily be suppressed. The plurality of the voltage layers 22*a*, 22*b*, 22*c*, and 22*d* includes: the first voltage layer 22*a* that is connected to the first battery 60 that has a first voltage value; and the second voltage layers 22*b*, 22*c*, and 22*d* that are connected to the second battery 61 that has a second voltage value lower than the first voltage value. Accordingly, different power supply voltages can be easily supplied.

Also, the plurality of layers 22 include the communication layer 22*f*, and thus a communication line can be connected to the communication layer 22*f*. The electronic control unit 70 is connected to the communication layer 22*f*, and selectively transmits, to the communication layer 22*f*, a signal transmitted from an external device to the device 80 that is connected to the communication layer 22*f*. Accordingly, the electronic control unit 70 can selectively decide the signal to be transmitted to the device 80 that is connected to the communication layer 22*f*.

Embodiment 2

Figure 6:
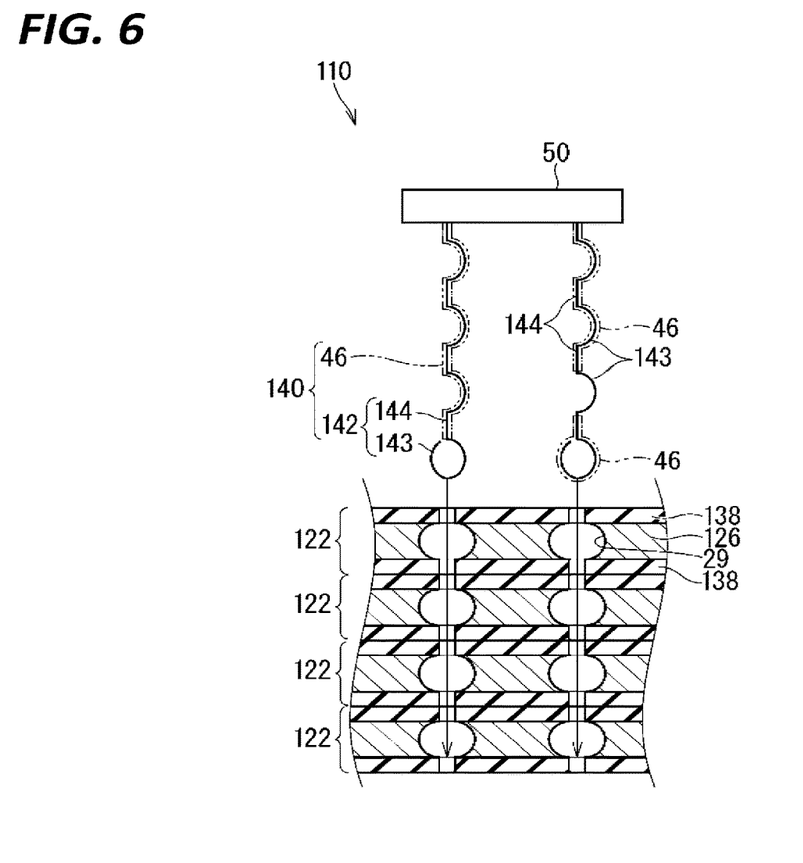
FIG. 6 is a side view of a circuit apparatus according to Embodiment 2.

A circuit apparatus according to Embodiment 2 will be described. FIG. 6 is a side view of a circuit apparatus 110 according to Embodiment 2. In the description of the present embodiment, constituent elements that are the same as those described above are given the same reference numerals, and a description thereof will be omitted. The same applies to embodiments given below.

In Embodiment 1, the connection members 26 are formed as leaf springs. However, in the present embodiment, terminals 140 are formed as leaf springs. More specifically, in the present embodiment, connection members 126 are formed by forming a plurality of holes 29 in conductor plates. The plurality of connection members 126 are insulated from each other by insulating portions 138. With this configuration, the likelihood of the connection members 126 of adjacent layers 122 being connected to each other is suppressed. For example, the insulating portions 138 are formed by providing insulating plates between the plurality of connection members 126 or forming insulating coatings on the surfaces of the connection members 126. The insulating portions 138 are provided so as not to close the holes 29 formed in the connection members 126. In other words, holes corresponding to the holes 29 are also formed in the insulating portions 138.

Each terminal 140 includes a terminal main body 142 and an insulation coating 46. The terminal main body 142 includes a plurality of contact point portions 143 and joint plate portions 144. The contact point portions 143 are portions that are inserted into the holes 29 of the connection members 126 and electrically connected to the connection members 126. The contact point portions 143 are formed as leaf springs. The plurality of contact point portions 143 are aligned in one direction. The joint plate portions 144 connect the plurality of contact point portions 143. For example, the terminal main body 142 is formed by bending a conductor plate. The insulation coating 46 is formed on a portion of the terminal main body 142 excluding the contact point portion 143 corresponding to a layer 122 that serves as the connection partner.

Embodiment 3

Figure 7:
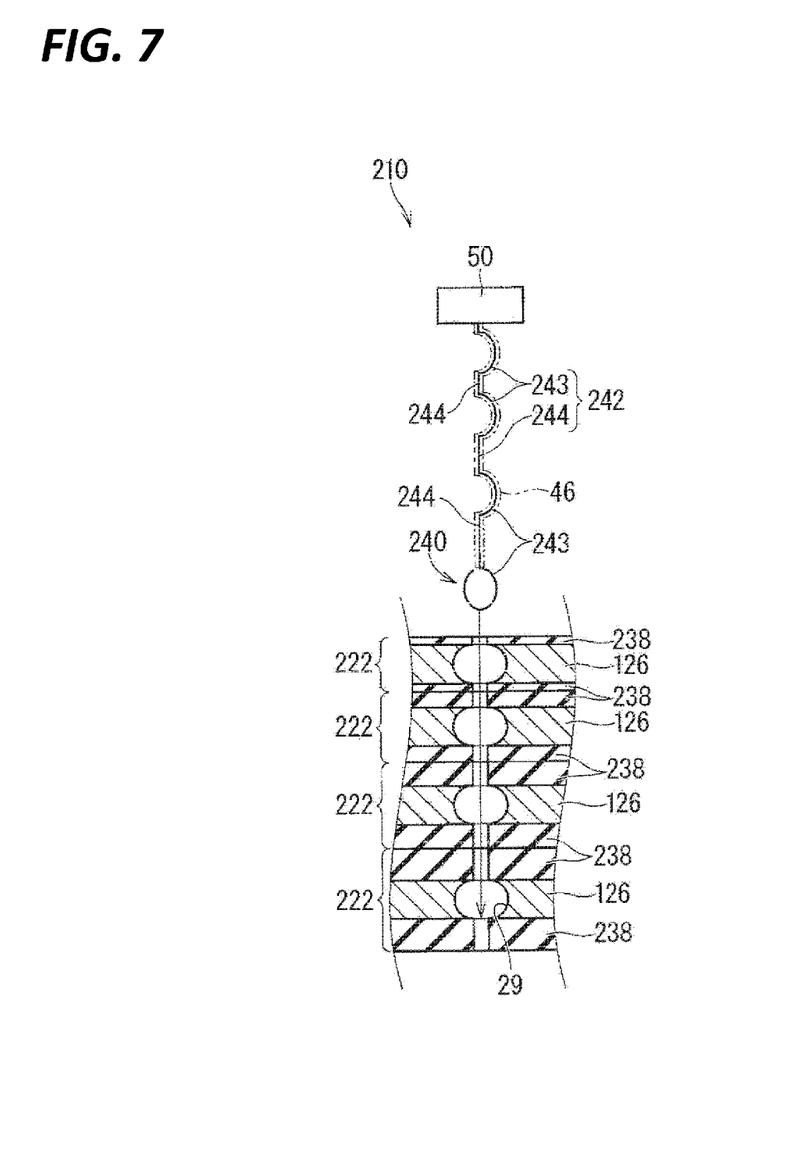
FIG. 7 is a side view of a circuit apparatus according to Embodiment 3.

A circuit apparatus according to Embodiment 3 will be described. FIG. 7 is a side view of a circuit apparatus 210 according to Embodiment 3.

In the present embodiment, a plurality of layers 222 have different thicknesses. Here, an example will be described in which terminals 240 are formed as leaf springs as in the example shown in FIG. 6. Of course, connection members 126 may be formed as leaf springs, as in the example shown in FIG. 2.

In the example shown in FIG. 7, the connection members 126 have the same thickness. In the example shown in FIG. 7, the plurality of layers 222 have different thicknesses due to insulating portions 238 having different thicknesses. Of course, the plurality of layers 222 have different thicknesses due to the connection members 126 having different thicknesses.

In order to deal with the plurality of layers 222 that have different thicknesses, in a terminal main body 242, the spacing between contact point portions 243 varies. In this example, joint plate portions 244 that connect the contact point portions 243 have different lengths. With this configuration, when a terminal 240 that is to be connected to the lowest layer 222 of a stacked body 220 is inserted to a layer 222 directly above the lowest layer 222, or in other words, when the terminal 240 is insufficiently inserted, the terminal 240 is likely to be unstable with respect to the stacked body 220. As a result, the likelihood of the circuit apparatus 210 being used with the terminal 240 being insufficiently inserted into the stacked body 220 can be suppressed.

In the example shown in FIG. 7, the plurality of layers 222 are stacked in ascending order of thickness. However, this configuration is not a requirement. The order in which the plurality of layers are stacked may be set as appropriate.

Embodiment 4

Figure 8:
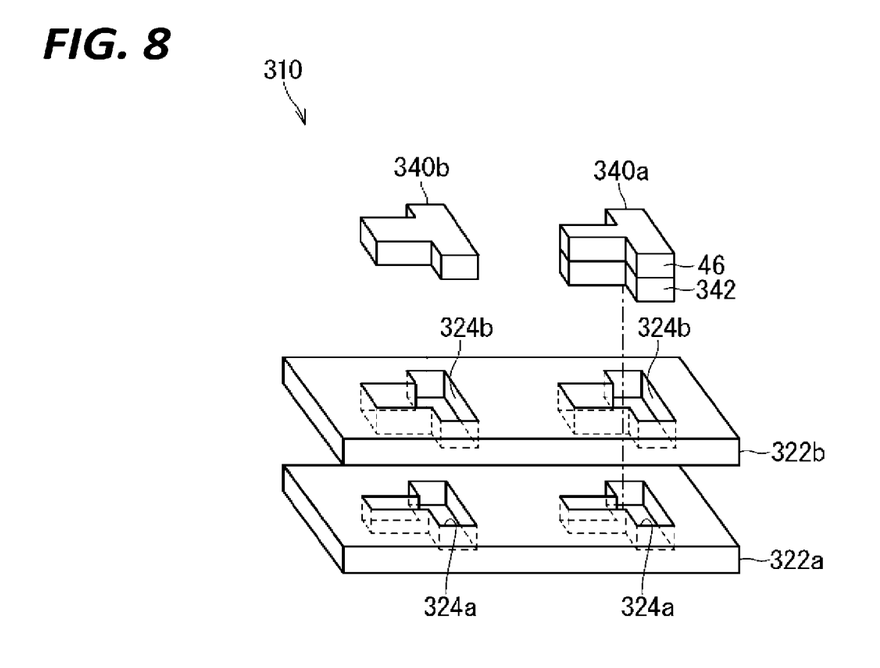
FIG. 8 is an exploded perspective view of a circuit apparatus according to Embodiment 4.

A circuit apparatus according to Embodiment 4 will be described. FIG. 8 is an exploded perspective view of a circuit apparatus 310 according to Embodiment 4.

The circuit apparatus 310 includes a plurality of layers including a first layer 322*a* and a second layer 322*b*. The second layer 322*b* is a layer located on the terminal insertion side relative to the first layer 322*a*. Holes 324*a* formed in the first layer 322*a* are smaller than holes 324*b* formed in the second layer 322*b*.

The circuit apparatus 310 includes a plurality of types of terminals including a first layer terminal 340*a* and a second layer terminal 340*b*. The first layer terminal 340*a* is a terminal that is connected to the first layer 322*a*. The first layer terminal 340*a* is passed through one of the holes 324*b* formed in the second layer 322*b* and one of the holes 324*a* formed in the first layer 322*a*, and connected to the first layer 322*a*. At a portion of the first layer terminal 340*a* that is not connected to the first layer 322*a*, more specifically, at a portion of the first layer terminal 340*a* that is fitted to the hole 324b of the second layer 322b when the first layer terminal 340a is connected to the first layer 322a, an insulation coating 46 is formed around a terminal main body 342. The second layer terminal 340b is a terminal that is connected to the second layer 322b. The second layer terminal 340b is passed through the other one of the holes 342b formed in the second layer 322b, and connected to the second layer 322b. The second layer terminal 340b is shorter than the first layer terminal 340a. Also, the second layer terminal 340b is formed to be larger than the hole 324a formed in the first layer 322a.

As described above, when the second layer terminal 340b is shorter than the first layer terminal 340a, the second layer terminal 340b is unlikely to be connected to the first layer 322a. Also, when the second layer terminal 340b is larger than the hole 324a formed in the first layer 322a, the second layer terminal 340b is unlikely to pass through the hole 324a formed in the first layer 322a, and thus the second layer terminal 340b is unlikely to be connected to the first layer 322a.

In the present embodiment, the holes 324a and 324b are formed in a T shape when viewed from the axial direction. Accordingly, the terminals 340a and 340b are also formed in a T shape when viewed from the axial direction. Naturally, the shape of the holes 324a and 324b and the terminals 340a and 340b need not necessarily be a T shape, and may be, for example, a square shape, a circular shape, or the like when viewed from the axial direction. The first layer terminal 340a is sized so as to continuously extend in the axial direction to the hole 324a formed in the first layer 322a. However, this configuration is not a requirement.

[Additional Statement]

Figure 9:
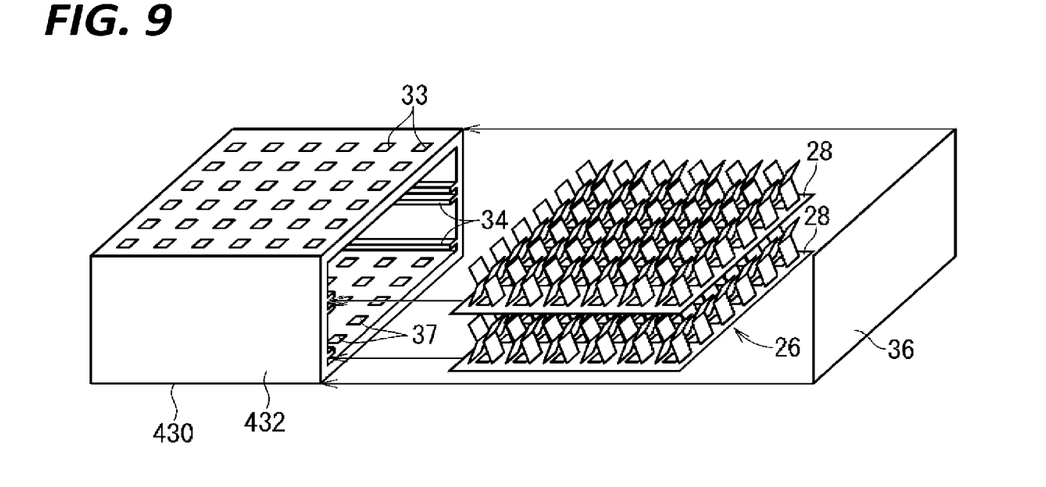
FIG. 9 is an exploded perspective view showing a variation of the stacked body.

In Embodiment 1, an example was described in which one connection member 26 is housed in one housing 30. However, this is not a requirement. As shown in FIG. 9, a plurality of connection members 26 in a stacked state may be housed in one housing 430. In this case, the stacked body may include only one housing 430, or may include a plurality of housings. In the case where the stacked body includes a plurality of housings, the plurality of housings may include housings that house different numbers of connection members 26.

As shown in FIG. 9, a box 432 may have an opening on a side that faces in a direction perpendicular to the stacking direction of the connection members 26. In the box 432, holes 33 and 37 are formed in a pair of side walls. Here, the side walls of the box 432 are surfaces that are perpendicular to the bottom of the box 432 located on the opposite side of the opening. In the case where a plurality of connection members 26 are housed in the box 432, edge supporting portions 34 that can support the edge portions of the joining portions 28 of the connection members 26 may be formed in the box 432. The edge supporting portions 34 are formed, for example, on side walls of the box 432 in which the holes 33 and 37 are not formed. The edge supporting portions 34 are formed on the side walls as grooved rails extending from the opening side toward the bottom side. Of course, partitions may be provided in the box 432 instead of the edge supporting portions 34. The partitions are formed as, for example, plates parallel to the side walls in which the holes 33 and 37 are formed, and divide the internal space of the single box 432 in the stacking direction. The connection members 26 are housed in the spaces formed by the partitions. In the partitions, holes corresponding to the holes 33 and 37 are formed.

In Embodiment 1, the stacked body 20 is configured to include six layers 22. However, this is not a requirement.

The stacked body 20 may be configured to include two layers, three layers, four layers, or five layers, or may be configured to include seven or more layers. Also, in Embodiment 1, the stacked body 20 is configured to include voltage layers 22a, 22b, 22c, and 22d, a communication layer 22f, and a ground layer 22e. However, this is not a requirement. There may be cases where, out of the voltage layers 22a, 22b, 22c, and 22d, the communication layer 22f, and the ground layer 22e, the voltage layers 22a, 22b, 22c, and 22d are omitted, the communication layer 22f is omitted, or the ground layer 22e is omitted. There also may be a case where, out of the voltage layers 22a, 22b, 22c, and 22d, the communication layer 22f, and the ground layer 22e, two layers, namely, the communication layer 22f and the ground layer 22e, are omitted. It is sufficient that the stacked body 20 includes at least one voltage layer.

Figure 10:
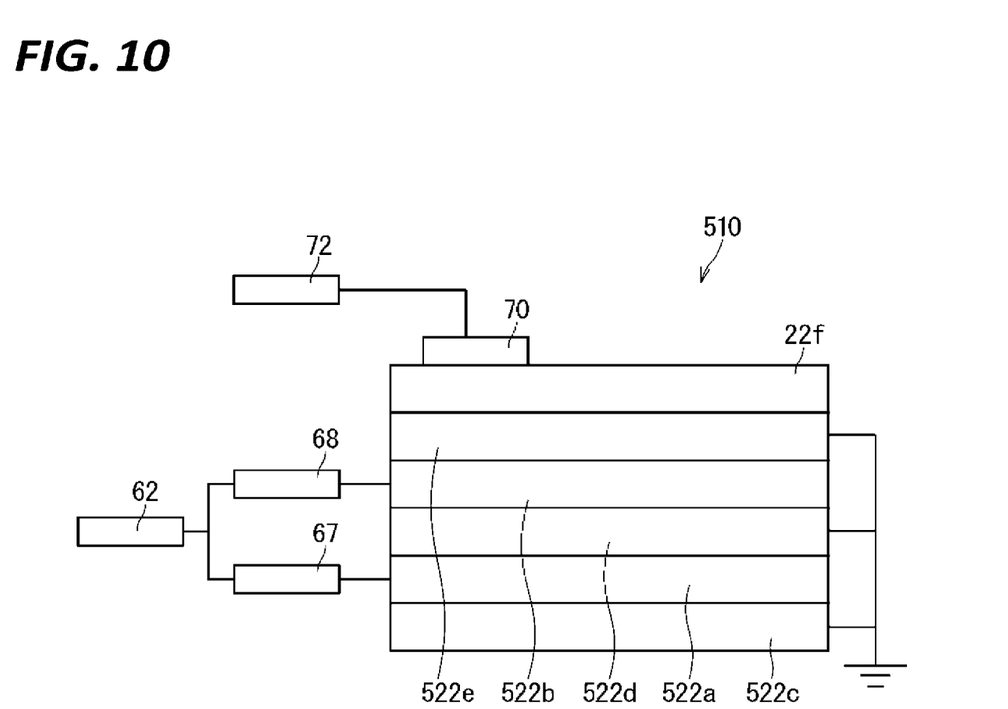
FIG. 10 is an exploded perspective view showing another variation of the stacked body.

In Embodiment 1, an example was described in which the circuit apparatus 10 is applied to a vehicle 90 that includes a plurality of batteries 60 and 61. However, this is not a requirement. As shown in FIG. 10, a circuit apparatus 510 may be applied to a motor vehicle (for example, an engine motor vehicle) that includes only one battery 62. In this case, when a plurality of layers 522 include a plurality of voltage layers 522a and 522b, at least one of the plurality of voltage layers 522a and 522b may be connected to the battery 62 via DC-DC converters 67 and 68. In the case of the engine motor vehicle, the voltage layers 522a and 522b may be connected to an alternator.

In Embodiment 1, an example was described in which one ground layer 22e is provided. However, this is not a requirement. For example, a ground layer may be provided separately for each voltage layer. Also, for example, as shown in FIG. 10, ground layers 522c, 522d, and 522e may be provided at positions so as to sandwich the plurality of voltage layers 522a and 522b.

In Embodiment 1, an example was described in which the connection members 26 are conductor plates. However, this is not a requirement. The connection members may be conductor films or the like. In this case, a connection member formed of a conductor film may be formed on the surface of an insulating substrate. For example, a conductor film may be formed on the entire surface of a substrate in which a plurality of holes are formed. Alternatively, for example, in the surface of a substrate in which a plurality of holes are formed, connection portions may be formed around the circumferences of the holes, and a joining portion may be formed so as to connect the circumferences of the holes.

The connection example in which the circuit apparatus 10 is applied to the vehicle shown in Embodiment 1 may be regarded as a wiring system in the vehicle.

The constituent elements in the embodiments and the variations described above may be combined as appropriate unless they are contradictory to each other.

LIST OF REFERENCE NUMERALS 10, 10a, 10b, 10c, 110, 210, 310, 510 Circuit apparatus
20, 220, 420 Stacked body
22, 122, 222, 522 Layer
22a First voltage layer (voltage layer, or layer)
22b, 22c, 22d Second voltage layer (voltage layer, or layer)
522a, 522b Voltage layer (layer)
22e, 522c, 522d, 522e Ground layer (layer)
22f Communication layer (layer)
322a First layer (layer)

322b Second layer (layer)
24, 324a, 324b Hole
26, 126 Connection member
27 Connection portion
28 Joining portion
29 Hole
30 Housing
32 Box
33 Hole
34 Edge supporting portion
36 Cover
37 Hole
138, 238 Insulating portion
40, 140, 240 Terminal
40a, 40b, 40c, 40d, 40e, 40f Plurality of types of terminals
340a First layer terminal
340b Second layer terminal
42, 142, 242 Terminal main body
143, 243 Contact point portion
144, 244 Joint plate portion
46 Insulation coating
50 Holding member
60 First battery
61 Second battery
62 Battery
64, 65, 66, 67, 68 DC-DC converter
70 Electronic control unit (ECU)
72 Central ECU
80, 80a, 80b, 80c, 80d, 80e, 80f, 80g, 80h, 80i Device
90 Vehicle

What is claimed is:

1. A circuit apparatus comprising:
a stacked body; and
a plurality of terminals,
wherein the stacked body includes a plurality of layers,
a plurality of holes that extend through the plurality of layers are formed in the stacked body,
each of the plurality of layers includes a connection member that is formed of a conductor,
the connection member includes: a pair of connection portions that are provided at positions corresponding to the plurality of holes; and a joining portion that connects the pair of connection portions to each other,
the plurality of terminals include a plurality of types of terminals that correspond to the plurality of layers, respectively,
each of the plurality of types of terminals is capable of being selectively connected to the pair of connection portions of a corresponding one of the plurality of layers by being inserted into a predetermined one of the plurality of holes,
the plurality of types of terminals include coated terminals,
each of the coated terminals includes a terminal main body and an insulation coating,
the terminal main body includes a first portion that corresponds to a layer that serves as a connection partner and a second portion that corresponds to layers that do not serve as the connection partner, and
the insulation coating is formed around the second portion.

2. A circuit apparatus comprising:
a stacked body; and
a plurality of terminals,
wherein the stacked body includes a plurality of layers,
a plurality of holes that extend through the plurality of layers are formed in the stacked body,
each of the plurality of layers includes a connection member that is formed of a conductor,
the connection member includes: a pair of connection portions that are provided at positions corresponding to the plurality of holes; and a joining portion that connects the pair of connection portions to each other,
the plurality of terminals include a plurality of types of terminals that correspond to the plurality of layers, respectively,
each of the plurality of types of terminals is capable of being selectively connected to the pair of connection portions of a corresponding one of the plurality of layers by being inserted into a predetermined one of the plurality of holes,
the plurality of layers includes a first layer and a second layer,
the plurality of types of terminals include a first layer terminal and a second layer terminal,
the second layer is located on a terminal insertion side relative to the first layer, the terminal insertion side being where the terminals are to be inserted,
the first layer terminal is a terminal that is to be connected to the first layer, and
the second layer terminal is a terminal that is to be connected to the second layer, and is shorter than the first layer terminal.

3. The circuit apparatus according to claim 2,
wherein the holes formed in the first layer are smaller than the holes formed in the second layer,
the first layer terminal is connected to the first layer while passing through one of the holes formed in the first layer and one of the holes formed in the second layer,
the second layer terminal is connected to the second layer while passing through another one of the holes formed in the second layer, and
the second layer terminal is formed to be larger than the hole formed in the first layer.

4. The circuit apparatus according to claim 1,
wherein the plurality of layers have different thicknesses.

5. A circuit apparatus comprising:
a stacked body; and
a plurality of terminals,
wherein the stacked body includes a plurality of layers,
a plurality of holes that extend through the plurality of layers are formed in the stacked body,
each of the plurality of layers includes a connection member that is formed of a conductor,
the connection member includes: a pair of connection portions that are provided at positions corresponding to the plurality of holes; and a joining portion that connects the pair of connection portions to each other,
the plurality of terminals include a plurality of types of terminals that correspond to the plurality of layers, respectively,
each of the plurality of types of terminals is capable of being selectively connected to the pair of connection portions of a corresponding one of the plurality of layers by being inserted into a predetermined one of the plurality of holes, and
the plurality of layers include a plurality of voltage layers that have different voltage values in the connection members.

6. The circuit apparatus according to claim 5,
wherein the plurality of voltage layers are stacked such that the voltage value increases in order from the terminal insertion side.

7. The circuit apparatus according to claim 5,
wherein the plurality of voltage layers include:
a first voltage layer that is connected to a first battery that has a first voltage value; and
a second voltage layer that is connected to a second battery that has a second voltage value lower than the first voltage value.

8. A circuit apparatus comprising:
a stacked body;
a plurality of terminals; and
an electronic controller,
wherein the stacked body includes a plurality of layers that includes a communication layer,
a plurality of holes that extend through the plurality of layers are formed in the stacked body,
each of the plurality of layers includes a connection member that is formed of a conductor,
the connection member includes: a pair of connection portions that are provided at positions corresponding to the plurality of holes; and a joining portion that connects the pair of connection portions to each other,
the plurality of terminals include a plurality of types of terminals that correspond to the plurality of layers, respectively,
each of the plurality of types of terminals is capable of being selectively connected to the pair of connection portions of a corresponding one of the plurality of layers by being inserted into a predetermined one of the plurality of holes, and
the electronic controller is connected to the communication layer, and selectively transmits, to the communication layer, a signal transmitted from an external apparatus to an apparatus that is connected to the communication layer.

\* \* \* \* \*